(12) United States Patent
Goux et al.

(10) Patent No.: US 8,008,644 B2
(45) Date of Patent: Aug. 30, 2011

(54) PHASE-CHANGE MEMORY CELL HAVING TWO INSULATED REGIONS

(75) Inventors: Ludovic Goux, Hannut (BE); Dirk Wouters, Heverlee (BE); Judit Lisoni, Oud-Heverlee (BE); Thomas Gille, Leuven (BE)

(73) Assignee: NXP B.V., Eindhoven (NL)

( * ) Notice: Subject to any disclaimer, the term of this patent is extended or adjusted under 35 U.S.C. 154(b) by 557 days.

(21) Appl. No.: 11/914,645

(22) PCT Filed: May 18, 2006

(86) PCT No.: PCT/IB2006/051575
§ 371 (c)(1),
(2), (4) Date: Jul. 10, 2008

(87) PCT Pub. No.: WO2006/123305
PCT Pub. Date: Nov. 23, 2006

(65) Prior Publication Data
US 2008/0265237 A1    Oct. 30, 2008

Related U.S. Application Data

(60) Provisional application No. 60/683,459, filed on May 19, 2005.

(30) Foreign Application Priority Data

May 18, 2006 (WO) .................. PCT/IB2006/051575

(51) Int. Cl.
*H01L 47/00* (2006.01)
(52) U.S. Cl. ............. 257/3; 257/2; 257/4; 257/E31.029; 438/95; 438/102; 438/103
(58) Field of Classification Search .................. 257/2, 3, 257/4, E31.029; 438/95, 102, 103
See application file for complete search history.

(56) References Cited

U.S. PATENT DOCUMENTS 7,897,952 B2 * 3/2011 Wouters et al. ................... 257/2
2003/0155589 A1 * 8/2003 Campbell et al. ............. 257/225
* cited by examiner

*Primary Examiner* — Ha Tran T Nguyen
*Assistant Examiner* — Suberr Chi

(57) ABSTRACT

A phase-change-memory cell is provided which comprises two insulated regions formed in a first phase-change material connected by a region formed in a second phase-change material. The crystallization temperature of the second phase-change material is below the crystallization temperature of the first phase-change material. By locally changing the material properties using a second PCM material, which switches phase at a lower temperature, a localized "hot spot" is obtained.

10 Claims, 4 Drawing Sheets

PHASE-CHANGE MEMORY CELL HAVING TWO INSULATED REGIONS

The invention relates to a phase change memory cell.

Standard Phase Change Memory (PCM) lateral/line type cell are designed with a geometrical constriction in the form of an hourglass pattern of the structure, as described in a paper by Martijn H. R. Lankhorst, Bas W. S. M. M. Ketelaars And R. A. M. Wolters., "Low-cost and nanoscale non-volatile memory concept for future silicon chips", Nature Materials, (Published online: 13 Mar. 2005), and a paper by P. Haring Bolivar, F. Merget, D.-H. Kim, B. Hadam and H. Kurz, "Lateral design for phase change random access memory cells with low-current consumption", EPCOS-2004 conference (see: www.epcos.org/pdf_2004/19paper_haringbolivar.pdf). As shown in FIG. 1, the current I will flow between the outer contacts or electrodes, here composed of an Al, WTi/TiN stack, through a central part formed in the phase-change material. This shape of the memory cell results in a local increase of the current density and hence in an increased heat generation due the Joule effect. During the device operation, this constricted area with the highest current density will be the first to melt.

Instead of reducing the cross-sectional area of the central part by reducing the width W thereof as shown in FIG. 1, a constriction in vertical direction, as disclosed in the Haring Bolivar paper, can be obtained by using a local thinning of the PCM layer thereby locally reducing the thickness t of the phase-change material.

The problem is that with scaling down the dimensions, both methods for geometrically confining the first-to-melt region are prone to process variations. The control of the geometry of the hourglass shape of FIG. 1 becomes more difficult. FIG. 2 shows the rounding effect due to lithographic processing generation causing the dimensions of the processed memory cell to deviate from the dimensions of the cell as-designed. The continuous line defines the cell as-designed, while the dashed line corresponds to the perimeter of the cell after lithographic patterning. This change in geometry and the spread thereon will result in larger variations of cell characteristics. The approach whereby the phase-change film thickness is reduced by etch as described in the Haring Bolivar paper is also not a well controlled process and will add to the variation.

There is a need for a more controllable method to form a phase-change-memory cell having a well-defined region of limited dimensions ("hot spot") resulting in a local increase of the current density during operation in this hot spot.

According to a first aspect of the invention there is provided a phase-change-memory cell comprising two insulated regions formed in a first phase-change material connected by a region formed in a second phase-change material whereby the crystallization temperature of the second phase-change material is below the crystallization temperature of the first phase-change material. This provides a solution to the problem described above that includes locally changing the material properties using a second PCM material, which switches phase at a lower temperature, e.g., the amount of energy needed to initiate the phase-change process is less for the second phase-change material compared to the first phase-change material. For a given current density, the region containing this second PCM material will first melt and hence a localized "hot spot" is obtained.

According to a second aspect of the invention there is provided a method for forming a phase-change-memory cell comprising two insulated regions formed in a first phase-change material connected by a region formed in a second phase-change material whereby the crystallization temperature of the second phase-change material is below the crystallization temperature of the first phase-change material, the method comprising:
  forming two insulated regions in a first phase-change material; and
  forming a region in a second phase-change material connecting the two insulated regions.

Embodiments of the present invention will now be described, by way of example only, with reference to the accompanying drawings, in which:—

Figure 1A:
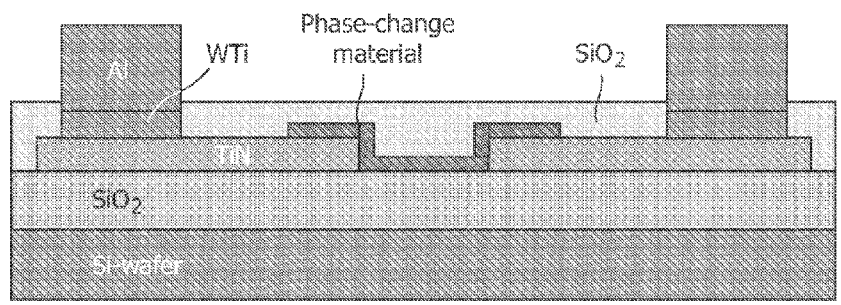
FIG. 1A shows a schematic cross-section and scanning electron micrograph of an example type of a PCM line cell with TiN contacts and Al bond-pads processed on a silicon wafer.
Figure 1A:
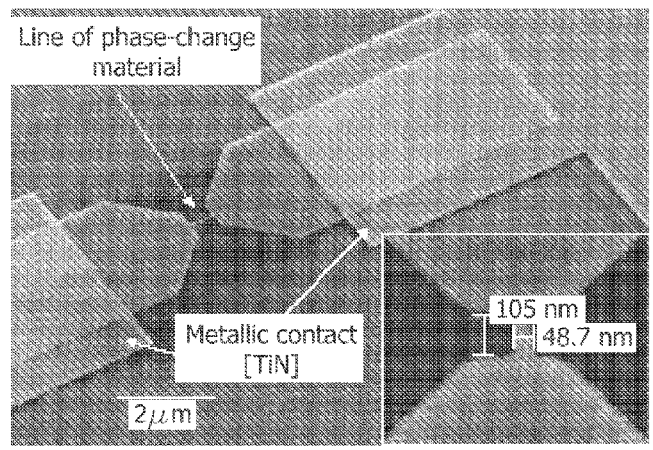
Figure 1B:
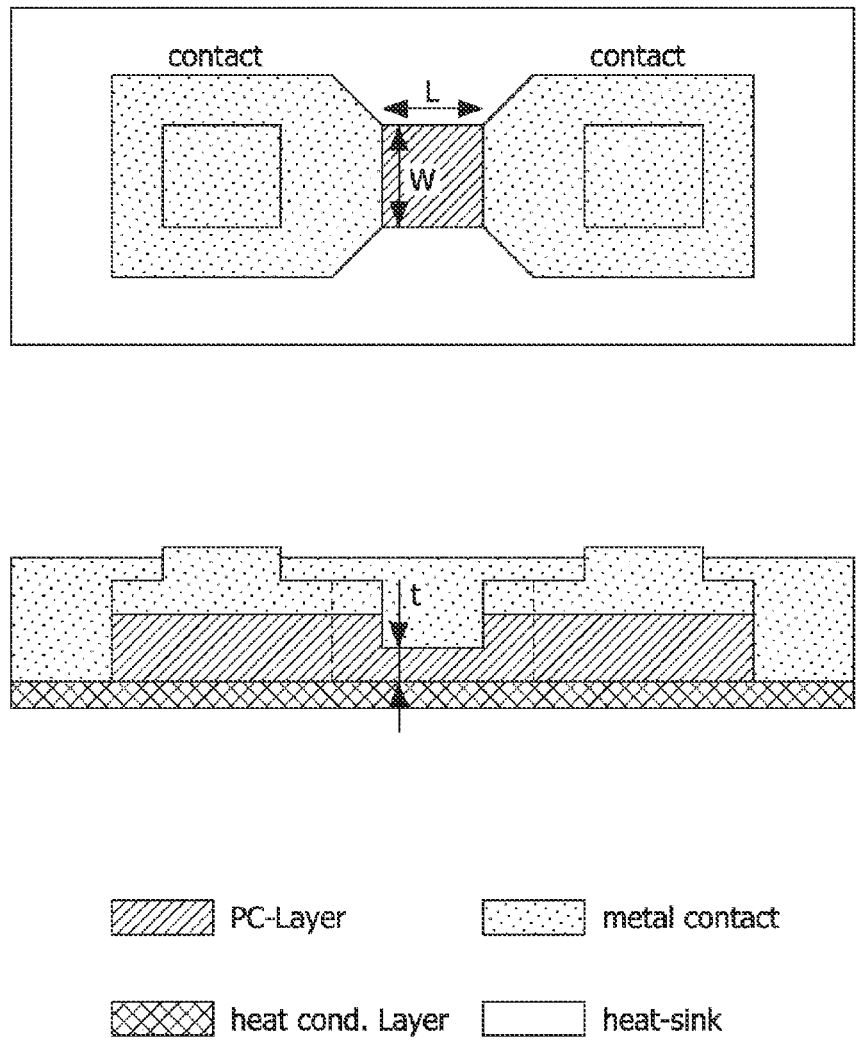
FIG. 1B shows a schematic cross-section and plan view of an example type of a PCM line cell.
Figure 2:
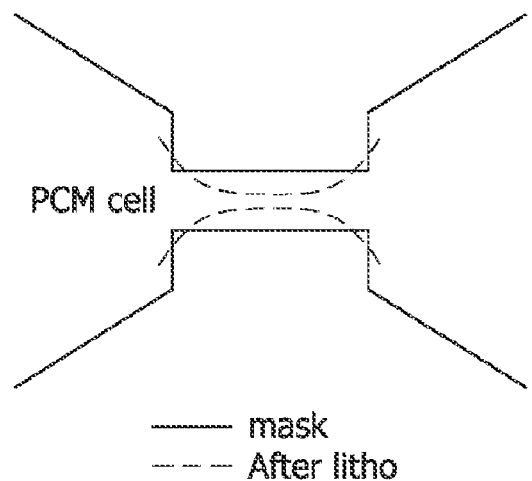
FIG. 2 shows a schematic plan view of part of a PCM cell.
Figure 3:
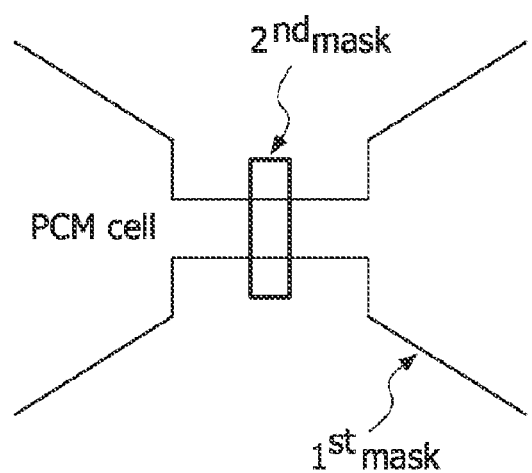
FIG. 3 shows a schematic plan view of part of a PCM cell during manufacture in accordance with the invention.

The process in accordance with the invention can be implemented as follows. A layer of a first PCM material such as GST225 is deposited on a substrate. This first PCM layer is patterned a first time, e.g. in the hourglass shape as shown in FIG. 2. In this first patterning step a removable hardmask such as TiW can be used. This hardmask is formed over the first PCM layer and patterned. In turn, the patterned hardmask is used to pattern the underlying first PCM layer. A second mask (FIG. 3) is then used to define the active region ("hot spot") or the first-to-melt region within this first patterned PCM layer. The first PCM layer is thus patterned a second time to remove a section of the central part in the PCM cell, thereby creating two insulated regions of the first PCM material. Again, a hardmask layer such as TiW can be used in this second patterning step in similar fashion as was done in the first patterning step. In an alternative embodiment, both the first and the second mask of FIG. 3 are combined into a single mask defining both insulated parts in one single patterning step.

If present, the hardmask layer is then selectively removed. A layer of second PCM material is then deposited which crystallizes at a temperature below the temperature of the first PCM layer. This second PCM layer can be Ge4. As this second PCM layer is deposited in a separate deposition step, its thickness can be chosen independently of the thickness of the first PCM layer. Whatever the thickness t2 of the second PCM layer, the cross-sectional area in a direction perpendicular to the current flow path is reduced (FIG. 4), and as the resistivity of the second PCM layer is selected to be the same as or less than the resistivity of the first PCM layer, this decreased cross-sectional area would result in an increase of the current density within this second PCM layer compared to the first PCM layer.

The second PCM layer is then patterned to form a conductive path between two corresponding insulated regions of the first PCM material. For the first considered option, the same hourglass mask as in the first patterning step may be used (e.g., the first mask). In this case, a stack of two PCM layers is formed with the layers aligned to each other.

Figure 5:
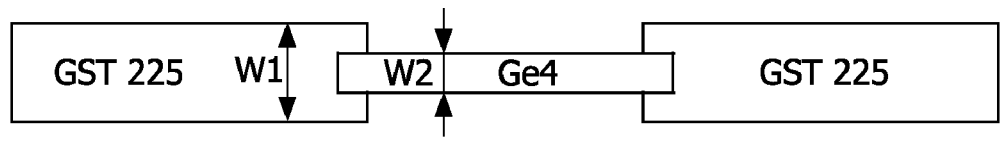
FIG. 5 is schematic top view of the active region in a second embodiment of the invention.

Although this patterned second PCM layer will extend from one insulated region to another insulated region that is formed in the first PCM layer, thereby bridging the gap separating the first PCM regions, its width W2 can be made less than the width W1 of the gap (FIG. 5). This way, the current density can be increased in this second PCM layer compared to the first PCM layer. This solution, which uses an additional mask, can be considered for the second option, wherein a different mask is used to pattern the second PCM layer. If present, the hardmask layer is then selectively removed.

The benefit of this new integration flow is that the material and geometry factors are combined to improve the controllability and, thus, the uniformity and reproducibility of cell characteristics.

Figure 4:
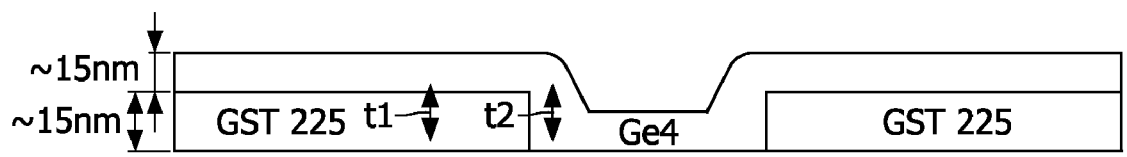
FIG. 4 is a schematic cross-section showing thinning of the active region during manufacture of the PCM cell in accordance with the invention.

The PCM material Ge4 located in the active region, e.g., the region constituting the "hot spot", melts, e.g., recrystallizes, at a lower temperature (thereby requiring a lower current density) than the PCM material GST 225 connecting the active region to the electrodes. The cross-sectional area is reduced in the active region not only in the width W (due to hourglass shape), but also in the thickness t because of the removal of GST 225 in the active region as shown in FIG. 4. Note that forming a thin layer by deposition is more controllable than by reducing the thickness of an as-deposited layer by a post etch process.

A benefit of this increased control is that melting will substantially only occur in the active area, and this melting will occur with a lower statistical spread of characteristics.

An additional benefit is that we reduce the risks of melt occurrence at the interface between the electrode and the phase-change material, which, if not reduce would likely result in segregation and/or a degradation in reliability. This benefit is substantially realized by using GST 225 in the periphery.

The invention claimed is:

1. A phase-change-memory cell comprising two insulated regions formed in a first phase-change material connected by a region formed in a second phase-change material whereby a crystallization temperature of the second phase-change material is below a crystallization temperature of the first phase-change material.

2. The memory cell of claim 1 whereby a cross-sectional area of the connecting region is less than a cross-sectional area of the insulated regions whereby a cross-section of each region is taken in a direction perpendicular to the direction defined by the insulated regions.

3. The memory cell of claim 2 whereby a width of the cross-sectional area of the connecting region is less a width of the cross-sectional area of the insulated regions.

4. The memory cell of claim 2 whereby a height of the cross-sectional area of the connecting region is less than a height of the cross-sectional area of the insulated regions.

5. A method for forming a phase-change-memory cell according to claim 1 comprising:
   forming two insulated regions in a first phase-change material; and
   forming a region in a second phase-change material connecting the two insulated regions.

6. The method of claim 5 wherein the step of forming two insulated regions comprises:
   forming a layer of the first phase-change material on a substrate; and,
   patterning this layer to form the two insulated regions.

7. The method of claim 6, wherein the step of patterning comprises:
   a first patterning step to form a region in the first phase-change material; and,
   a second patterning step separating this region into two insulated regions.

8. The method of claim 6, wherein the step of forming the connecting region comprises:
   forming a layer of the second phase-change material over the patterned layer of the first phase-change material; and,
   patterning this second layer to form a region connecting the two insulated regions.

9. The method of claim 8, wherein the second layer is patterned using a mask.

10. The method of claim 8, wherein the second layer is patterned such that the width of the cross-sectional area of the connecting region is less than the width of the cross-sectional area of the insulated regions.

* * * * *